US006743027B1

(12) United States Patent
Kowtun

(10) Patent No.: US 6,743,027 B1
(45) Date of Patent: Jun. 1, 2004

(54) REMOTE ZONE CONNECTOR AND SYSTEM

(75) Inventor: Peter Kowtun, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/249,129

(22) Filed: Mar. 18, 2003

(51) Int. Cl.[7] .......................... H01R 12/00; H05K 1/00; H02G 3/00; H02P 7/00

(52) U.S. Cl. .................... 439/76.2; 439/76.1; 307/10.1; 318/466

(58) Field of Search ................................ 439/76.2, 955; 318/466, 467, 567, 568.1; 307/10.1

(56) References Cited

U.S. PATENT DOCUMENTS 4,956,561 A * 9/1990 Tamer ....................... 307/10.1
5,668,698 A * 9/1997 Jozwiak et al. ............. 361/752
6,198,244 B1 * 3/2001 Hayden et al. ............. 318/466
6,494,723 B2 * 12/2002 Yamane et al. ............ 439/76.2
6,522,528 B2 * 2/2003 Yamane ...................... 361/601
6,573,616 B2 * 6/2003 Yamane ...................... 307/10.1

* cited by examiner

*Primary Examiner*—Chandrika Prasad
(74) *Attorney, Agent, or Firm*—Larry A. Shelton, Esq.

(57) ABSTRACT

A remote zone connector (26) includes a circuit board (36) that has an onboard circuit (38) with a node (90). The node (90) is configured for an electrical device (28) that has a capability level of at least semi-smart. Multiple electrical connections (40) are electrically coupled to the circuit board (36). A remote zone connector housing (42) securely retains the circuit board (36) and engages with the plurality of electrical connections (40). The remote zone connector housing (42) includes a supply mating section (66) and multiple device mating sections (68).

19 Claims, 3 Drawing Sheets

REMOTE ZONE CONNECTOR AND SYSTEM

CROSS REFERENCE TO RELATED APPLICATIONS

The present invention is related to U.S. Patent Application Ser. No. 10/249,155 entitled "RF Remote Zone Connector and System", which is incorporated by reference herein and filed simultaneously with this application.

BACKGROUND OF INVENTION

The present invention relates to electrical and electronic system architecture and componentry, and more particularly, to an apparatus and system for remotely coupling to and controlling various devices within a vehicle.

Modern vehicles include various electronic components and control systems providing many electrically controlled features. Some of the features relate to operation of a vehicle, such as operation of a powertrain, steering system, or braking system, whereas others enhance occupant convenience, such as power seat systems, door lock control systems, and heating ventilation air conditioning HVAC control systems. Typically, a designated controller or a central controller, which is sometimes referred to as a module, controls operation of the features.

A module often includes a microprocessor having processing circuitry, input biasing and protection circuitry, and output power switching capability. The module may control devices, such as motors, and receive data from corresponding sensors. In order to operate the motors multiple high current drivers are Included within the module. The devices and the sensors are coupled to the module by multiple conductors. Depending on,location of the devices relative to the module, a large quantity of parallel conductors may be routed throughout the vehicle in the form of a vehicle harness. Due to an abundant amount of conductors the vehicle harness may have considerable weight and complexity.

The amount of electronic and electrical features within a vehicle are continuously increasing. With ever increasing electrical and electronic features comes increased vehicle harness weight and complexity. Thus, there is a desire to increase design and operation flexibility and to minimize weight and complexity of vehicle electrical systems.

It has been suggested in U.S. Pat. No. 6,198,244 B1, entitled "Electronic Architecture for Controlling an Electronic Seat", to partition a vehicle into regions each region having a designated controller and any number of local networks. The local networks are coupled to their assigned or designated controllers. Each local network includes a series of serially coupled dumb connectors or smart connectors, each of which being coupled to a respective electrical device, such as a motor, a heater, or a sensor. A dumb connector is coupled to a smart device and a smart connector is coupled to a dumb device.

Although, the '244 patent may simplify the size and weight of a main vehicle or input harness, the '244 patent continues to utilize a substantial input harness and has other associated disadvantages. The input harness couples the regional controllers to a separate fuse block, containing interrupt circuitry, the combination thereof being of considerable weight that is undesirable. The '244 patent also utilizes a large quantity of regional controllers, and an even larger quantity of smart detectors. Each smart connector is assigned to a single designated and separate electronic device. Since there is a large quantity of smart connectors additional associated weight is included therein. Thus, the electrical system of the '244 patent is not only relatively heavy but is also relatively complex due to the relatively large quantity of components.

It is therefore desirable to provide an apparatus and system for remotely coupling to and controlling various devices within a vehicle that is relatively simple in design, lightweight, and inexpensive.

SUMMARY OF INVENTION

The present invention addresses the issues described above and provides an apparatus and system for remotely coupling to and controlling various devices within a vehicle. A remote zone connector is provided that includes a circuit board with an onboard circuit. The electrical circuit has a node that is configured for an electrical device with a capability level of at least semi-smart. Multiple electrical connections are electrically coupled to the circuit board. A remote zone connector housing securely retains the circuit board and engages with the plurality of electrical connections. The remote zone connector housing includes a supply mating section and multiple device mating sections.

One of several advantages of the present invention is that it provides a remote zone connector that is capable of controlling multiple devices having various capability levels.

Another advantage of the present invention is that it eliminates need of a main vehicle harness or input harness and provides a remote zone connecting system that utilizes one or more remote zone connectors. In so doing the present invention is simple in design, relatively lightweight, and inexpensive to manufacture.

Furthermore, the present invention minimizes impact of adding new electronic or electrical features to a vehicle electrical system. In utilizing the present invention an electronic or electrical feature may be added to the architecture of the present invention with minimal increase in electrical components.

The present invention itself, together with further objects and attendant advantages, will be best understood by reference to the following detailed description, taken in conjunction with the accompanying drawing.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
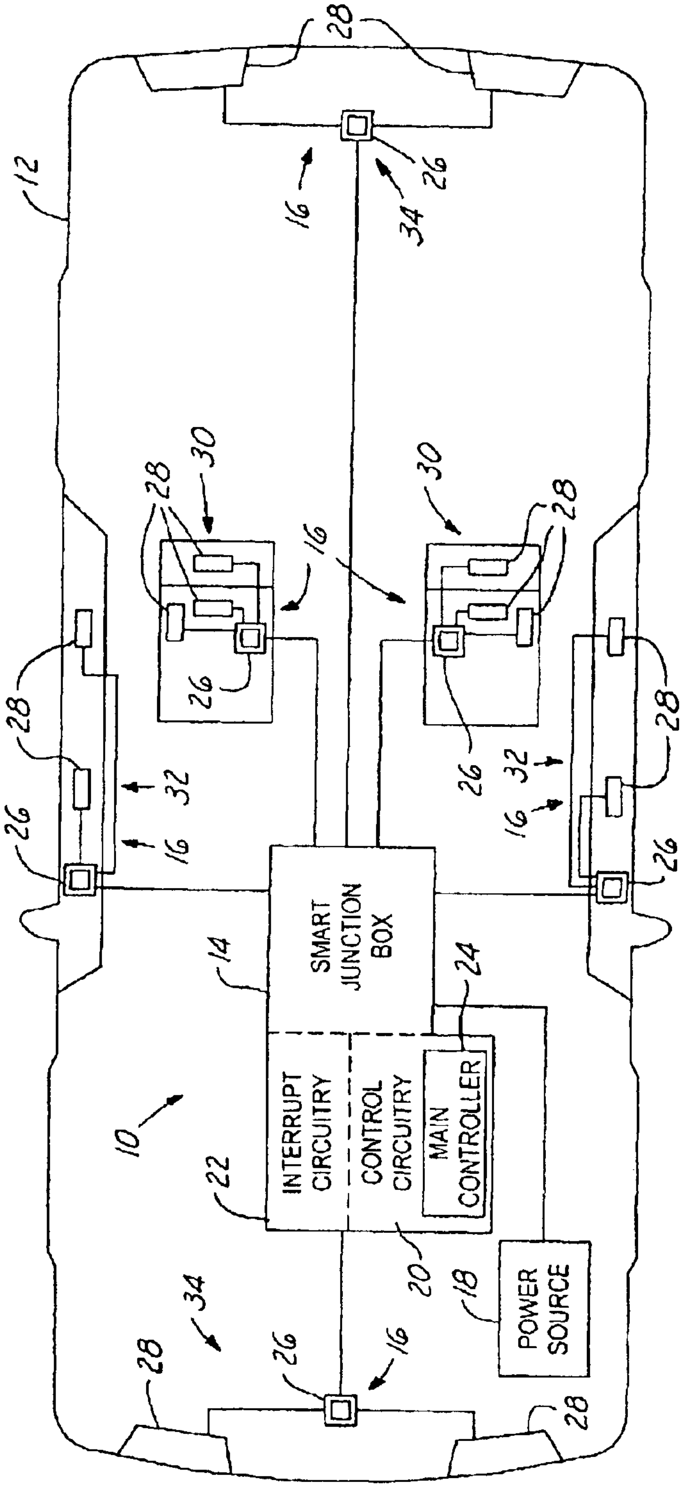
FIG. 1 is a block diagrammatic view of a remote zone connecting system In accordance with an embodiment of the present invention.

In the following figures the same reference numerals will be used to refer to the same components. While the present invention is described with respect to apparatus and system for remotely coupling to and controlling various devices within a vehicle, the present invention may be adapted and applied to various systems including: electrical systems, door systems, headliner systems, heating systems, seating systems, lighting systems, vehicle systems, non-vehicle electrical systems, or other systems known in the art. The present invention may also be applied to instrument panels, trunk areas, window and roof motors and switches, electronic clusters, and other electronic devices known in the art.

In the following description, various operating parameters and components are described for one constructed embodiment. These specific parameters and components are included as examples and are not meant to be limiting.

Referring now to FIG. 1, a block diagrammatic view of a remote zone connecting system 10 for a vehicle 12 in accordance with an embodiment of the present invention is shown. The remote zone connecting system 10 includes a smart junction box 14 and multiple remote zone connector circuits 16. Although, a smart junction box is shown some other form of electronic control module known in the art may be used, such as a body controller. The smart junction box 14 supplies power from a power source 18 to the remote zone circuits 16. The smart junction box 14 has control circuitry 20 for operating multiple electronic and electrical features associated with each remote zone circuit 16.

The smart junction box 14 includes interrupt circuitry 22 and a main controller 24, within the control circuitry 20. The interrupt circuitry 22 may be in the form of fuses or sensors, may be software driven, or may be in some other form of interrupt or protection circuitry known in the art. The interrupt circuitry 22 provides short circuit protection. The main controller 24 is preferably microprocessor based such as a computer having a central processing unit, memory (RAM and/or ROM), and associated input and output buses. The main controller 24 may perform load switching, load diagnosis, load current and data acquisition, load current controlled pulse width modulation, and other known tasks known in the art. Although, the smart junction box 14 is shown as and is preferably a single unit it may be separated into individual components.

The remote zone circuits 16 include multiple remote zone connectors 26, which are coupled to the smart junction box 14 and to multiple electronic or electrical devices 28. The remote zone connectors 26 supply power from the smart junction box 14 to the devices 28.

In operation, the smart junction box 14 determines a desired state of a device, such as devices 28, and generates control signals to the remote zone connectors 26. In response to the control signals the remote zone connectors 26 either generate command signals or directly operate the devices 28, The remote zone connectors 26 may receive status signals from the devices 28 and relay the status signals to the main controller 24. Status signals may contain vehicle internally related information, such as internal actuator positions, internal temperatures, velocity or may contain externally related information, such as object detection information including object position, range, and velocity relative to the vehicle 12.

The devices 28 may have various capability levels; each device may be considered to be a smart device, a semi-smart device, a dumb device, or a device of some other capability level known in the art. A smart device, in general, contains electronics for relatively more complex functions such as serial data communication to and from the smart device and power switching. A smart device is typically able to perform computational functions. A dumb device on the other hand, typically receives power and possibly data and operates with minimal or basic electronics. A dumb device, in general, is not capable of performing computational functions. A semi-smart device, such as a seat motor having a built in driver, is neither considered a smart device or a dumb device since it ordinarily performs minimal computations and often does not perform any computations, but yet has electronics of a somewhat higher level of complexity than that of a dumb device.

Although, in FIG. 1 the present invention is shown as being applied to vehicle seat systems 30, door systems 32, and lighting systems 34, FIG. 1 is intended to be for example purposes only. Of course, the present invention may be applied to various other systems and devices.

Figure 2A:
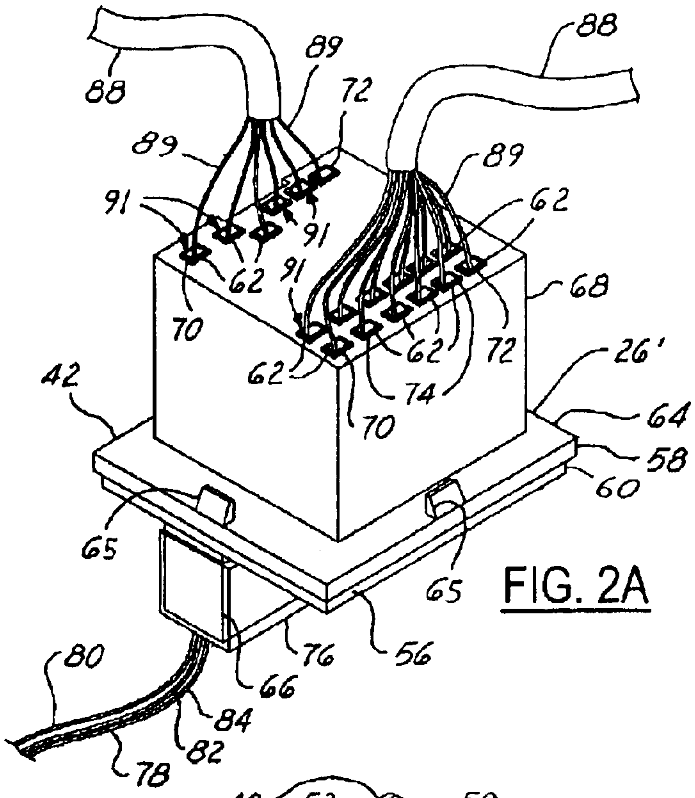
FIG. 2A is a perspective view of a remote zone connector in accordance with an embodiment of the present invention.
Figure 2B:
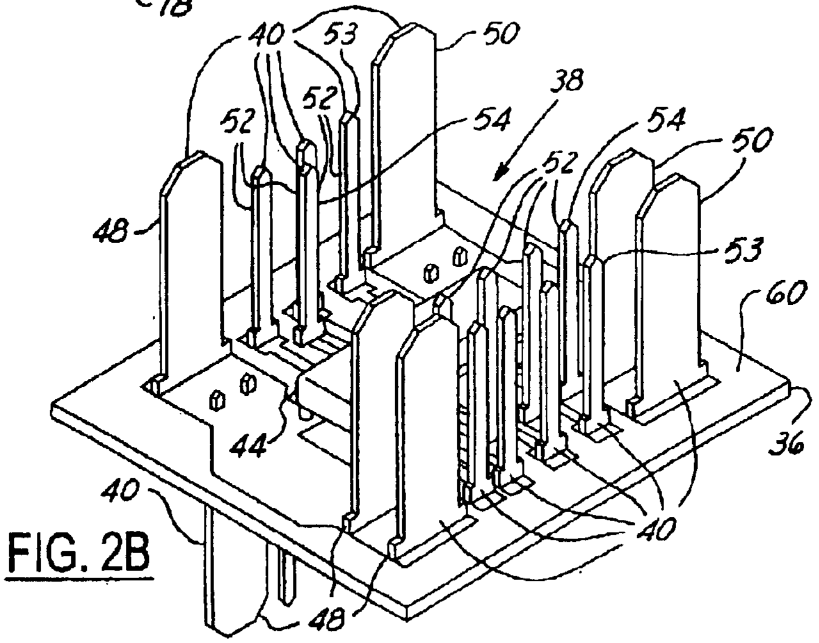
FIG. 2B is a perspective view of a circuit board for the remote zone connector of FIG. 2A in accordance with an embodiment of the present invention.

Referring now to FIGS. 2A and 2B, perspective views of a remote zone connector 26' and of a corresponding circuit board 36 are shown in accordance with an embodiment of the present invention. The remote zone connector 26' includes the circuit board 36 that has an onboard circuit 38. Multiple electrical connections 40 are coupled to the circuit board 36. A remote zone connector housing 42 securely retains the circuit board 36 and engages with the electrical connections 40.

The onboard circuit 38 includes one or more integrated circuit devices 44 (only one is utilized in this example) and the electrical connections 40. The integrated circuit 44 may perform serial data communication, computational functions, power switching, or other tasks or functions known in the art. The electrical connections 40 include power connections 48, ground connections 50, and receive and transmit or control connections 52. Some of the control connections 52 may be feedback connections 53 or spare connections 54. Although, all the connections 40 are shown as being of some form of a male connection they may be of some other connection form(s) known in the art.

The remote zone housing 42 includes a supply side housing 56 and a control side housing 58 that rigidly mate to an outer periphery 60 of the circuit board 36. The supply side housing 56 and a control side housing 58 each have multiple female receptacle slots 62 that engage with the electrical connections 40. The female receptacles 62, again are shown as one possible example of a connection that may be used to engage with the electrical connections 40. The supply side housing 56 and the control side housing 58 have overlapping lips 64 with snapping fasteners 65 for coupling over the outer periphery 60 and rigidly fastening the supply side housing 56 to the control side housing 58. The supply side housing 56 and the control side housing 58 may be coupled to each other using methods other than the fasteners 65, as known in the art. The overlapping lips 64 prevent the circuit board 36 from moving within the remote zone housing 42 and aids in maintaining connection between the electrical connections 40 and the receptacle slots 62. The outer periphery 60 is non-conductive and is conducive for mating to the housing 42.

The supply side housing 56 includes a supply mating section 66 and the control side housing 58 includes one or more device mating sections 68 (only one is utilized in this example). The supply mating section 66 and the device mating section 68 may be on separate sides of the remote zone connector 26', as shown, so as to provide a "through" connection configuration, may be on the same side, may be In a combination thereof, or may be in some other configuration known in the art. The mating sections 66 and 68 include power connections 70, ground connections 72, and control connections 74.

Figure 3:
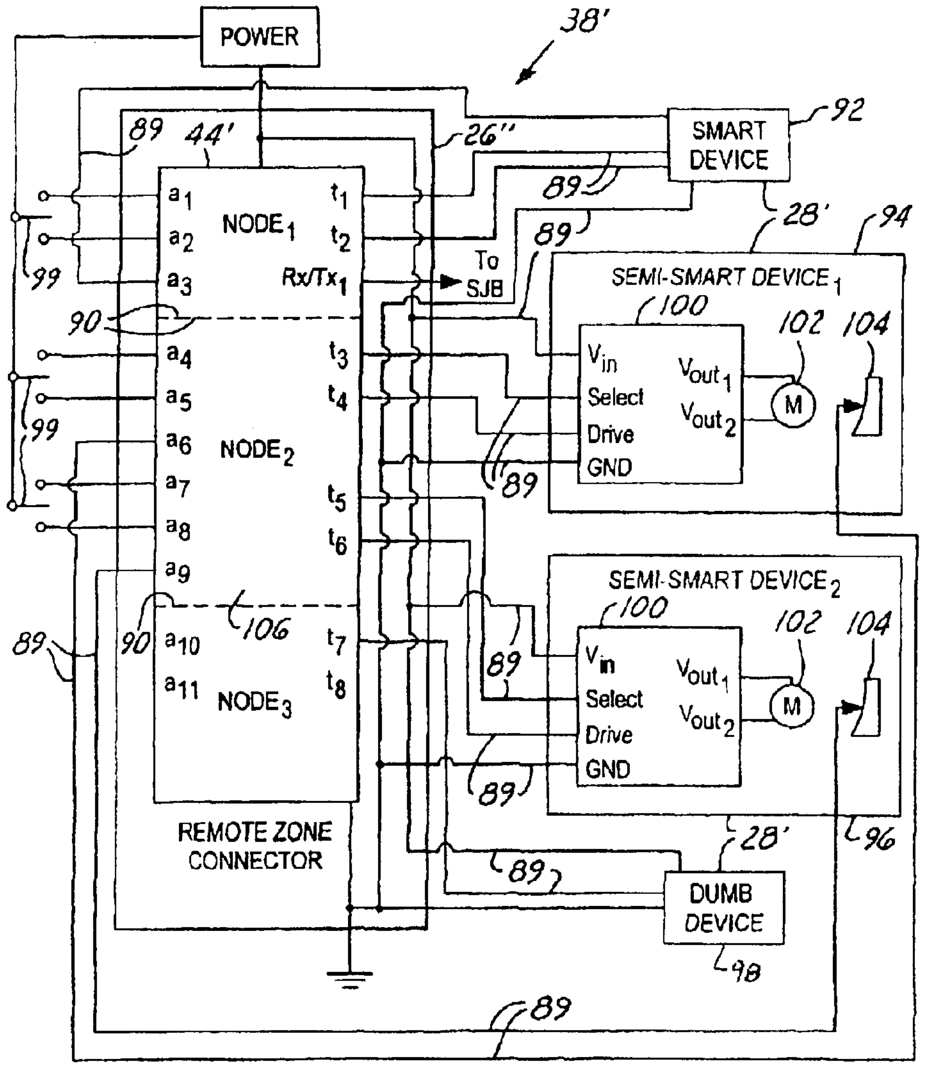
FIG. 3 is a schematic view of a remote zone connector circuit in accordance with an embodiment of the present invention.

The supply mating section 66 mates to a supply connector 76 of a serial input cable 78. The serial input cable 78 contains a serial input line 80, a power line 82, and a ground line 84. The device mating section 68 mates to one or more control cables 88. Each control cable 88 includes one or more serial drive lines, power lines, and ground lines, which are best illustrated by the schematic of FIG. 3 and represented by lines 89. The lines 89 may have terminals (not shown) crimped thereon and engage into cavities 91 or have respective connector (not shown) mating to the control side housing 58, where they are then electrically coupled to some of the electrical connections 40. The supply cable 78 and the control cables 88 may be mated to a single connector (not shown) and have a corresponding single mating section (not shown) on the remote zone connector 26'.

Referring now to FIG. 3, a schematic view of a remote zone connector circuit 38' in accordance with an embodiment of the present invention is shown. The remote zone circuit 38' includes a remote zone connector 26" with an integrated circuit device 44' and multiple devices 28'. The integrated circuit 44' may have any number of nodes 90 and be coupled to any number of devices, such as devices 28'. The devices 28' again may have various capability levels. For example purposes only, a smart device 92, a first semi-smart device 94, a second semi-smart device 96, and a dumb device 98 are coupled to respective nodes 90 of the integrated circuit 44' and may have respective operating switches 99. Note, that the devices 28' are parallely connected to the remote zone connector 26".

The semi-smart devices 94 and 96, being of the same status level and servicing similar purposes, share a common node, thereby, simplifying the Integrated circuit 44'. Each of the semi-smart devices 94 and 96 include a driver 100, a motor 102, and a position sensor 104 for determining position of actuated members (not shown). For example, the motors 102 may be within a seat system, such as seat systems 32, and control actuated members contained therein to adjust seat positioning.

The nodes 90 are configured for each of the electrical devices 28' to account for the various capability levels and purposes of each device. The nodes 90 may be in the form of a local interconnect network node, a car area network node, a flexible firmware routine node, or in some other form of communication node known in the art. The nodes 90 may be configured and have software contained therein so as to be shared by multiple electrical devices, as illustrated by a second node 106 and the semi-smart devices 94 and 96.

The present Invention provides for simple and easy reconfiguration of an electrical system for new electrical features and associated electronic devices. Instead of requiring incorporation of additional conductors, connectors, modules, etc., as in the prior art, simple software changes to a smart junction box and to an integrated circuit of a remote zone connector are all that may be needed. Thus, the present invention exhibits minimal weight increases with increase in electronic features; weight increases are primarily from the new electronic devices themselves. When a new electronic feature is added to a remote zone connecting system of the present invention software of one or more existing nodes is adjusted or a new node is added. As stated above, when similar devices that serve similar purposes are used the devices may share a single node.

The present invention provides a versatile remote zone connector and remote zone connecting system that may be utilized in various electronic and electrical applications. The present invention is relatively simple and lightweight in design and inexpensive to manufacture.

While the invention has been described in connection with one or more embodiments, it is understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A remote zone connector comprising:

a circuit board having onboard circuit with at least one node that is configured for at least one electrical device, said at least one electrical device having a capability level of at least semi-smart;

said at least one node activating and controlling operation of said at least one electrical device;

a plurality of electrical connections electrically coupled to said circuit board; and a remote zone connector housing securely retaining said circuit board and engaging with said plurality of electrical connections, said remote zone connector housing comprising:

a supply mating section; and at least one device mating section.

2. A connector as in claim 1 wherein said onboard circuit comprises at least one integrated circuit device.

3. A connector as in claim 1 wherein said at least one node is selected from a local interconnect network node, a car area network node, and a flexible firmware routine node.

4. A connector as in claim 1 wherein said at least one node is configured to be shared by a plurality of electrical devices.

5. A connector as in claim 1 wherein said at least one node comprises:

a first node that is configured for a first electrical device; and a second node that is configured for a second electrical device.

6. A connector as in claim 1 wherein said plurality of electrical connections comprise:

a plurality of power connections;

a plurality of ground connections; and a plurality of control connections.

7. A connector as in claim 1 wherein said plurality of electrical connections comprise at least one feedback connection.

8. A connector as in claim 1 wherein said plurality of electrical connections comprise:

a plurality of male power connections;

a plurality of maleb ground connections; and a plurality of male control connections.

9. A connector as in claim 1 wherein said remote zone connector housing comprises:

a supply side housing; and a control side housing.

10. A connector as in claim 9 wherein said supply side housing and said control side housing are configured to mate with a serial input line and at least one serial drive line, respectively.

11. A connector as in claim 1 wherein said supply mating section comprises:

a power connection;

a ground connection; and a control connection.

12. A connector as in claim 1 wherein said at least one device mating section comprises:

at least one power connection;

at least one ground connection; and at least one control connection.

13. A connector as in claim 1 wherein said remote zone connector housing rigidly mates to an outer periphery of said circuit board.

14. A remote zone connecting system comprising:

an electrical control module; and a remote zone connector circuit comprising:

at least one electrical device; an a remote zone connector electrically coupled to said electronic control module and said at least one electrical device, said remote zone connector supplying command signals to or receiving status signals from said at least one electrical device wherein said at least one electrical device is a semi-smart device or a smart device.

15. A system as in claim 14 wherein said remote zone connector comprises:

a circuit board having an onboard circuit with at least one node that is configured for an electrical device having a capability level of at least semi-smart;

a plurality of electrical connections electrically coupled to said circuit board; and a remote zone connector housing securely retaining said circuit board and engaging with said plurality of electrical connections, said remote zone connector housing comprising:

a supply mating section; and at least one device mating section.

16. A system as in claim 15 wherein said remote zone connector is coupled to a smart junction box via a serial input line.

17. A system as in claim 15 wherein said remote zone connector is coupled to said at least one electrical device via at least one serial drive line.

18. A system as in claim 15 wherein said remote zone connector is coupled to said at least one electrical device via a mini-harness.

19. A remote zone connector comprising:

a circuit board having an onboard circuit with at least one node that is configured for at least one electrical device, said at least one electrical device having a capability level of at least semi-smart;

a plurality of electrical connections electrically coupled to said circuit board comprising:

a plurality of power connections;

a plurality of ground connections; and a plurality of control connections; and a remote zone connector housing securely retaining said circuit board and engaging with said plurality of electrical connections, said remote zone connector housing comprising:

a supply mating section; and at least one device mating section.

* * * * *